United States Patent [19]
Pfiester

[11] Patent Number: 4,966,864
[45] Date of Patent: Oct. 30, 1990

[54] CONTACT STRUCTURE AND METHOD

[75] Inventor: James R. Pfiester, Austin, Tex.

[73] Assignee: Motorola, Inc., Schaumburg, Ill.

[21] Appl. No.: 329,167

[22] Filed: Mar. 27, 1989

[51] Int. Cl.⁵ .................. H01L 21/44; H01L 21/48
[52] U.S. Cl. .................................. 437/191; 437/195; 437/52
[58] Field of Search ............. 437/191, 186, 195, 192, 437/49, 51, 52

[56] References Cited

U.S. PATENT DOCUMENTS

| | | | |
|---|---|---|---|
| 3,921,282 | 11/1975 | Cunningham et al. | 437/51 |
| 4,290,188 | 9/1981 | Ichinose et al. | 437/142 |
| 4,619,037 | 10/1986 | Taguchi et al. | 437/195 |
| 4,685,197 | 8/1987 | Tigelaar et al. | 437/195 |
| 4,717,449 | 1/1988 | Erie et al. | 437/195 |
| 4,808,261 | 2/1989 | Ghidini et al. | 437/191 |
| 4,808,555 | 2/1989 | Mauntel et al. | 437/191 |
| 4,874,719 | 10/1989 | Kurosawa | 437/49 |
| 4,877,483 | 10/1989 | Bergemont et al. | 437/191 |

FOREIGN PATENT DOCUMENTS

0283991 9/1988 European Pat. Off. ............ 437/191

*Primary Examiner*—Brian E. Hearn
*Assistant Examiner*—Trung Dang
*Attorney, Agent, or Firm*—John A. Fisher

[57] ABSTRACT

A semiconductor device structure including a contact and a method for its fabrication are disclosed. In accordance with one embodiment of the disclosure, a contact is formed between a monocrystalline silicon substrate and an overlying silicon layer. A silicon substrate is provided which has a first insulating layer formed thereon. A layer of silicon is deposited and patterned over the insulator layer. The patterned silicon layer is then oxidized and a contact opening is etched through the first insulator layer and the silicon dioxide is expose portions of the silicon substrate and an adjacent portion of the patterned silicon layer. A further layer of polycrystalline silicon is then selectively deposited onto the exposed portions of the substrate and silicon layer to form an electrical connection between the two.

13 Claims, 2 Drawing Sheets

CONTACT STRUCTURE AND METHOD

BACKGROUND OF THE INVENTION

This invention relates generally to semiconductor devices and to a method for their manufacture, and more specifically to a contact structure used in a semiconductor device and to a method for its manufacture.

In the fabrication of semiconductor devices, especially high density MOS integrated circuits, a significant amount of space on the integrated circuit die is used in making electrical contact between the semiconductor substrate and an overlying conductor layer or between two conductor layers overlying the substrate, or between a plurality of overlying layers and the substrate. The amount of area used for these contacts is minimized by using a "buried contact" or "shared contact." In a silicon gate MOS integrated circuit, for example, a buried contact achieves an electrical contact between the monocrystalline substrate and an overlying polycrystalline silicon interconnect by exposing a portion of the substrate and directly contacting that portion with an impurity doped polycrystalline silicon line. In a shared contact, the silicon substrate and a first overlying polycrystalline silicon pattern are electrically coupled together by a second level of polycrystalline silicon overlying the first.

Although the desirability of buried contacts or shared contacts is apparent from the amount of space which can be saved in the implementation of an integrated circuit function on a thin wafer of semiconductor material, the implementation of these contacts is not without problems. One of the major problems encountered in fabricating buried contacts or shared contacts is the pitting or etching of the underlying semiconductor substrate during the patterning of the overlying polycrystalline silicon lines. For example, in the conventional method for fabricating a buried contact, an oxide layer is grown on a silicon substrate and an opening is etched through that oxide layer to expose the intended contact area. A layer of polycrystalline silicon is then deposited over the oxide layer and extending through the opening to make contact with the silicon substrate. When the polycrystalline silicon layer is then patterned to form the necessary pattern of interconnecting lines, any over etching of the layer of polycrystalline silicon causes an etching of the underlying silicon substrate. Because the polycrystalline silicon in the contact openings is directly in contact with the silicon substrate, there is no etch-stop indicator which indicates when the etching of the polycrystalline silicon has been completed. The etchant for polycrystalline silicon is equally effective in etching the then exposed underlying substrate. A similar problem arises in the fabrication of shared contacts.

A need therefore existed for an improved contact and method for its fabrication which would overcome the problems attendant with the conventional fabrication of buried contacts and shared contacts.

It is therefore an object of this invention to provide an improved contact between first and second silicon structures.

It is a further object of this invention to provide an improved method for fabricating semiconductor devices including contacts between first and second silicon structures.

It is yet another object of this invention to provide an improved semiconductor device structure.

It is yet another object of this invention to provide an improved method for fabricating semiconductor devices.

It is a still further object of this invention to provide an improved means and method for electrically coupling between conductor levels of an integrated circuit.

BRIEF SUMMARY OF THE INVENTION

The foregoing and other objects and advantages of the invention are achieved with a contact structure which utilizes the selective deposition of a refractory conductor such as polycrystalline silicon to achieve an electrical connection between first and second conductive structures. In accordance with one embodiment of the invention a semiconductor device is fabricated by providing a first silicon structure with an overlying layer of insulating material. A layer of silicon is deposited and selectively patterned over the insulator layer. A further layer of insulation is formed over the patterned layer of silicon and a contact opening is formed through the insulator layers to expose portions of both the first silicon structure and the overlying layer of silicon. A further layer of polycrystalline silicon is then selectively deposited on the exposed portions of both the first silicon structure and the layer of silicon to form an electrically conductive bridge therebetween.

DETAILED DESCRIPTION OF PREFERRED EMBODIMENTS

FIGS. 1–4 illustrate, in cross-section, process steps in accordance with one embodiment of the invention. For purposes of illustration, the invention is described with reference to the manufacture of an N-channel MOS transistor. Those skilled in the art will recognize, of course, that P-channel transistors can be made by the same process with an appropriate change in doping types. Likewise, with appropriate masking, CMOS devices can be made by the same process. Still further, in this illustrative embodiment, the structures being electrically coupled are silicon as is the coupling material. The invention is equally applicable to other conductive and semiconductive materials, regardless of crystalline structure or lack thereof. The figures illustrate the fabrication of a portion of a semiconductor device. In the fabrication of an actual integrated circuit, the illustrated structure would be repeated many times on each circuit and on each substrate.

Figure 1:
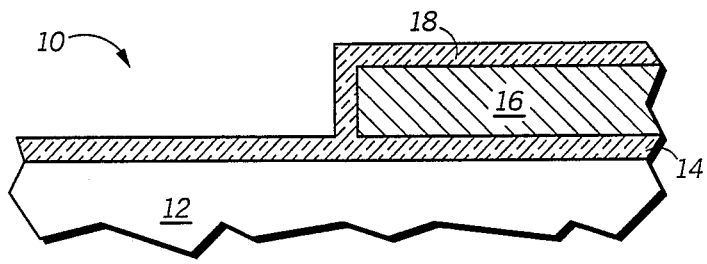
FIGS. 1–4 illustrate, in cross-section, process steps in accordance with one embodiment of the invention.

Early in the processing of a semiconductor device 10, the device includes a semiconductor substrate 12 over which an insulating layer 14 has been formed. A layer of polycrystalline silicon is deposited over the insulator layer 14 and is patterned to form a polycrystalline silicon electrode 16. The patterning is accomplished using conventional photolithography. During the etching of polycrystalline silicon electrode 16, the surface of substrate 12 is protected from the etchant by insulator 14. A layer of insulating material 18 is then formed over the surface of patterned polycrystalline silicon electrode 16 as illustrated in FIG. 1. Preferably both insulator 14 and insulator 18 are thermally grown silicon dioxide, although one or both may be deposited oxides or other insulating materials.

Figure 2:
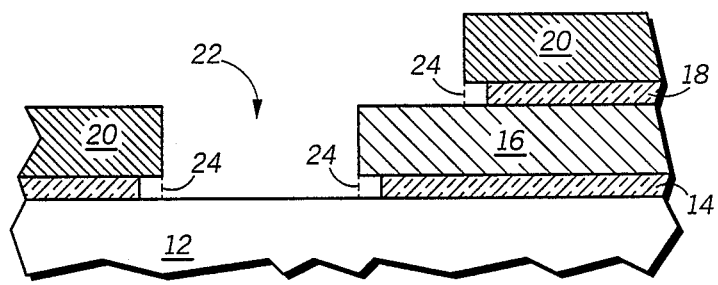

The process continues, as illustrated in FIG. 2, by applying a photoresist layer 20 over the insulated structure and by patterning that photoresist layer to form a contact opening 22. Using the patterned photoresist as an etch mask, insulating layers 14 and 18 are etched to expose a portion of substrate 12 and a portion of the end of polycrystalline silicon electrode 16. Contact opening 22 is large enough in size and is positioned to expose a portion of the substrate and an adjacent portion of the polycrystalline silicon electrode. If the opening 22 is etched using a wet etchant or other isotropic etchant, some undercutting of photoresist pattern 20 and electrode 16 will be observed, as illustrated in FIG. 2. If an anisotropic etchant is used, no undercutting will be observed and the resultant opening will be more like that illustrated by the dashed lines 24. The type of etchant used to etch the contact opening, whether wet, dry, isotropic or anisotropic, is not material to the practice of the invention.

Figure 3:
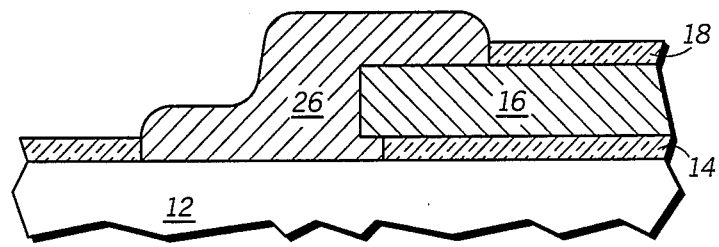

In accordance with the invention and as illustrated in FIG. 3, a refractory material, and preferably polycrystalline silicon, is selectively deposited to form a bridge 26 which electrically couples polycrystalline silicon electrode 16 and substrate 12. If no high temperature steps are to be used in the remainder of the process, the bridge can also be made by the selective deposition of a material such as aluminum. Polycrystalline silicon bridge 26 is selectively deposited by a well known chemical vapor deposition techniques which deposit the bridging polycrystalline silicon material only on exposed silicon surfaces. As illustrated, selectively deposited polycrystalline silicon bridge 26 deposits only on the exposed portion of substrate 12 and the exposed portion of electrode 16. If the insulator 14 was undercut during the etching of contact opening 22, that undercut area is filled during the selective deposition process. Selective deposition is a process in which the deposition conditions are adjusted, in well known manner, to cause the material to be deposited only on those portions of the structure from which the insulating layers have been removed.

Figure 4:
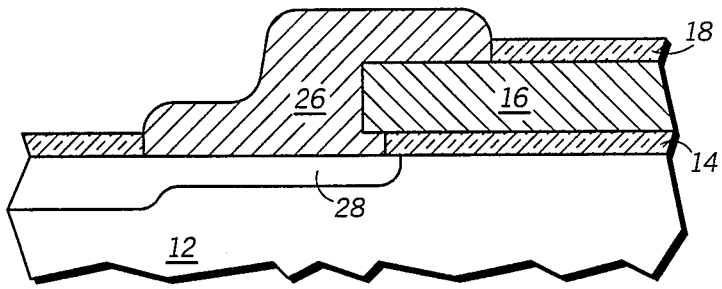

In accordance with one embodiment of the invention, the structure is completed, as illustrated in FIG. 4, by process steps including the ion implantation or other doping of the structure with N-type conductivity determining dopant impurities. Implanting the structure causes the formation of a doped region 28 in substrate 12 as well as doping the bridging material 26 and polycrystalline silicon electrode 16. In addition, an optional implantation of conductivity determining dopant ions (not shown) can be carried out prior to the selective deposition process to dope the exposed silicon portions and to thereby insure a low contact resistance between bridge 26 and the silicon to be contacted. This optional implant is especially important if the bridge material is selectively doped tungsten, molybdenum, or other refractory metal. Still further, the exposed silicon portions can be silicided prior to the selective deposition process step.

The structure illustrated in FIG. 4 is formed without performing any etching steps which will cause pitting of substrate 12. Polycrystalline silicon electrode 16 is patterned while the substrate is protected by insulating layer 14. Opening 22, which exposes a portion of substrate 12, is formed with an etchant which selectively etches insulator 14 without appreciably etching substrate 12. For example, if insulator 14 is silicon dioxide and substrate 12 is monocrystalline silicon, the insulator layer can be etched in a buffered solution of hydrofluoric acid without appreciably effecting silicon substrate 12. Additionally, because polycrystalline silicon connection 26 is selectively deposited, no patterning and etching steps are required to define this connection.

In one specific embodiment of the invention, polycrystalline silicon electrode 16 is a gate electrode, insulator 14 is a gate oxide, and doped region 28 is a source or drain electrode of an MOS transistor. Polycrystalline connection 26 thus forms an electrical connection or strap between the gate electrode and the source or drain region. Polycrystalline silicon connection 26 forms a buried contact as is used, for example, in a static RAM cell, pull up resistor or the like.

Figure 5:
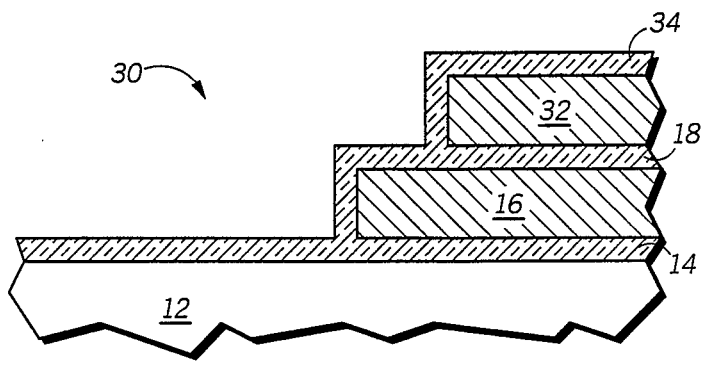
FIGS. 5–7 illustrate, in cross-section, process steps in accordance with a further embodiment of the invention.
Figure 6:
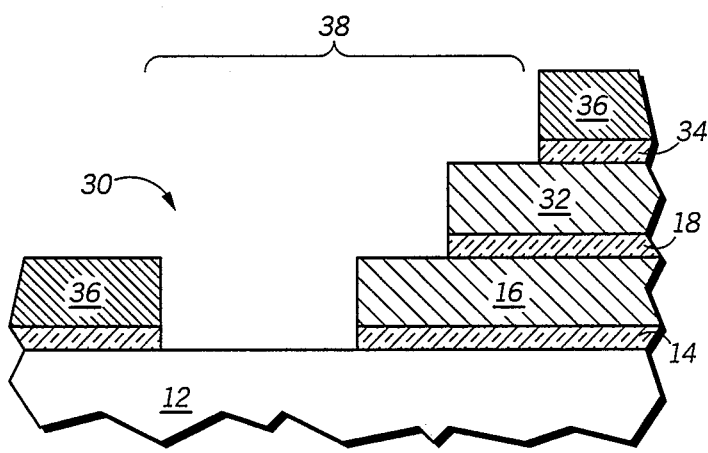
Figure 7:
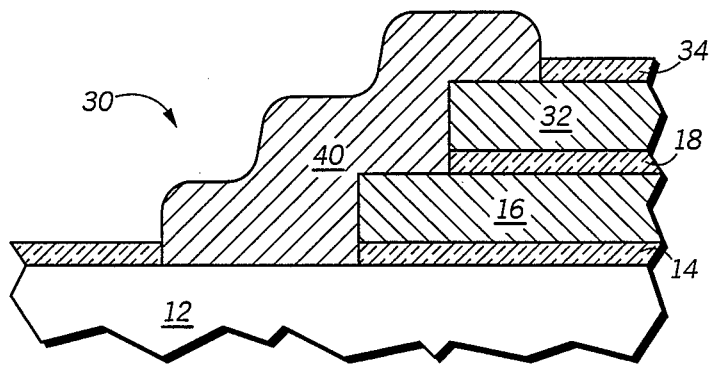

FIGS. 5–7 illustrate schematically, in cross-section, process steps in accordance with a further embodiment of the invention. Device 30 formed in this embodiment begins with a structure similar to that illustrated in FIG. 1. An insulating layer 14 is formed overlying a silicon substrate 12. A polycrystalline silicon electrode 16 is formed on insulator layer 14, for example, by chemical vapor depositing a layer of polycrystalline silicon and photolithographically patterning the layer to achieve the desired shape. An insulating layer 18 is formed overlying polycrystalline silicon electrode 16. An additional polycrystalline silicon layer is then deposited over the structure and patterned to form an additional polycrystalline silicon level 32. Level 32 can be, for example, an additional layer of interconnection, can include a resistor layer, or the like. After patterning level 32, a layer of insulating material is formed thereover by thermal oxidation or other means.

As illustrated in FIG. 6, the process continues by depositing and patterning a layer of photoresist 36 to define an contact opening 38. Using the photoresist as an etch mask, insulating layers 14, 18, and 34 are patterned to expose within contact opening 38, a portion of substrate 12, an adjacent portion of polycrystalline silicon electrode 16, and an adjacent portion of polycrystalline silicon level 32. As illustrated in FIG. 6, with this embodiment the insulating layers are etched in an etchant which does not produce undercutting.

The contact structure is completed by the selective deposition of a polycrystalline silicon strap 40 which electrically couples together substrate 12, polycrystalline silicon electrode 16, and polycrystalline silicon level 32. Strap 40 is formed by a selective deposition process so that no masking and etching operations are necessary in its formation and no silicon is left exposed during the patterning of any other silicon layer. During the previous patterning of silicon layers 16 and 32, all other silicon was protected from the etchant by a layer of insulator. Strap 40 illustrated in FIG. 7 illustrates a shared contact as often used, for example, in static RAM cells.

Thus it is apparent that there has been provided, in accordance with the invention, a device structure and a method for its fabrication which fully meets the objects and advantages set forth above. Although the invention has been described and illustrated with reference to specific embodiments thereof, it is not intended that the invention be limited to these illustrative embodiments. Those skilled in the art will recognize that variations and modifications are possible without departing from the spirit of the invention. For example the contacting structures illustrated can be used in forming contacts between any conductor layers, preferably silicon layers, including the substrate and silicon or other conductor layers formed overlying that substrate. Additionally, the silicon layers can be a monocrystalline substrate, a polycrystalline silicon layer, an amorphous silicon layer, or the like. Still further, the selectively deposited polycrystalline silicon can be deposited as an undoped layer which is subsequently doped by ion implantation or thermal diffusion, or it can be deposited as a doped layer in which the dopant is incorporated during the deposition process. Thus it is intended to encompass within the invention all such variations and modifications as fall within the scope of the appended claims.

I claim:

1. A method for fabricating a semiconductor device including forming a contact between first and second silicon structures comprising the steps of:
   providing a first silicon structure having a first insulator layer thereover;
   depositing a layer of silicon overlying said first insulator layer;
   selectively patterning said layer of silicon;
   forming a second insulator layer overlying said layer of silicon;
   patterning said first and second insulator layers to expose a portion of said first silicon structure and a portion of said layer of silicon;
   and selectively depositing a further layer of polycrystalline silicon onto the exposed portions of said first silicon structure and said layer of silicon and bridging therebetween.

2. The method of claim 1 wherein said step of providing a first silicon structure comprises providing a monocrystalline silicon substrate.

3. The method of claim 2 wherein said step of depositing a layer of silicon comprises the step of depositing a layer of polycrystalline silicon.

4. The method of claim 3 wherein said step of forming a second insulator layer comprises thermally oxidizing said layer of polycrystalline silicon.

5. The method of claim 1 wherein said step of providing a first silicon structure comprises providing a first layer of polycrystalline silicon.

6. The method of claim 5 wherein said step of depositing a layer of silicon comprises the step of depositing a second layer of polycrystalline silicon.

7. The method of claim 1 further comprising the step of implanting impurity doping ions to form a doped region in said first silicon structure.

8. A method for fabricating a semiconductor device comprising the steps of:
   providing a silicon substrate having an insulator layer formed on a surface thereof;
   depositing a first layer of polycrystalline silicon overlying said insulator layer;
   patterning said first layer of polycrystalline silicon to define an electrode;
   forming an oxide layer on said electrode;
   forming a contact opening through said insulator layer adjacent said electrode to expose a portion of said silicon substrate and simultaneously removing said oxide layer from a portion of said electrode adjacent said contact opening; and
   selectively depositing polycrystalline silicon on said exposed portion and said portion of said electrode and forming an electrical connection therebetween.

9. The method of claim 8 further comprising the step of ion implanting said selectively deposited polycrystalline silicon, said electrode and said silicon substrate with conductivity determining ions.

10. The process of claim 8 further comprising the step of implanting conductivity determining ions through said contact opening and into said silicon substrate before said step of selectively depositing.

11. The process of claim 8 wherein said step of depositing a first layer of polycrystalline silicon comprises the step of chemical vapor depositing a layer of polycrystalline silicon in situ doped with conductivity determining impurities.

12. A method for fabricating a semiconductor device comprising the steps of:
   providing a first conductor structure having a first insulator layer thereover;
   forming a second conductor structure overlying said first insulator layer;
   forming a second insulator layer overlying said second conductor structure;
   etching an opening through said first and second insulator layers to expose adjacent portions of said first and second conductor structures; and
   selectively depositing a further layer of conductive material onto said exposed adjacent portions and forming an electrical connection therebetween.

13. The method of claim 12 wherein the step of selectively depositing comprises the step of selectively depositing a material selected from the group consisting of silicon, refractory metals, and aluminum.

* * * * *